(12) United States Patent
Ikebe et al.

(10) Patent No.: US 7,705,351 B2
(45) Date of Patent: Apr. 27, 2010

(54) FLIP CHIP SEMICONDUCTOR PACKAGING DEVICE AND TESTING METHOD USING FIRST AND SECOND REFLECTORS FOR DETERMINING GAP BETWEEN CHIP AND CIRCUIT BOARD OR FIRST AND SECOND CHIPS

(75) Inventors: Nobuaki Ikebe, Oita (JP); Toshiaki Iwafuchi, Oita (JP); Michihiro Satou, Oita (JP); Yuji Yamagata, Oita (JP)

(73) Assignee: Sony Corporation, Tokyo (JP)

( * ) Notice: Subject to any disclaimer, the term of this patent is extended or adjusted under 35 U.S.C. 154(b) by 499 days.

(21) Appl. No.: 11/620,909

(22) Filed: Jan. 8, 2007

(65) Prior Publication Data
US 2008/0144048 A1 Jun. 19, 2008

(30) Foreign Application Priority Data
Jan. 13, 2006 (JP) .............................. 2006-005821

(51) Int. Cl.
*H01L 23/58* (2006.01)
*G01B 11/14* (2006.01)
(52) U.S. Cl. ................. 257/48; 257/678; 257/E23.002; 356/626; 356/630; 356/631
(58) Field of Classification Search .................... 257/48, 257/678, E23.002; 356/626–630; 228/103
See application file for complete search history.

(56) References Cited

U.S. PATENT DOCUMENTS

2005/0023450 A1* 2/2005 Ito .......................... 250/231.13

2006/0081983 A1* 4/2006 Humpston et al. .......... 257/738

FOREIGN PATENT DOCUMENTS

| JP | 3-88369 | 9/1991 |
|---|---|---|
| JP | 05-235136 | 9/1993 |
| JP | 08-124985 | 5/1996 |
| JP | 10-032307 | 2/1998 |
| JP | 10-050769 | 2/1998 |
| JP | 10-190187 | 7/1998 |
| JP | 2000-31585 | 11/2000 |
| JP | 2004-363172 | 12/2004 |
| JP | 2005-150441 | 6/2005 |

OTHER PUBLICATIONS

Japanese office Action issued on Nov. 4, 2009 in connection with corresponding JP Application No. 2006-005821.

* cited by examiner

*Primary Examiner*—Marcos D Pizarro
*Assistant Examiner*—Raj Gupta
(74) *Attorney, Agent, or Firm*—Sonnenschein Nath & Rosenthal LLP

(57) ABSTRACT

A semiconductor device includes: a circuit board; a semiconductor chip mounted over the circuit board with a predetermined gap therebetween and electrically connected to the circuit board by a protruding electrode; a first resin material filled into the gap between the circuit board and the semiconductor chip; a second resin material that seals the semiconductor chip mounted over the circuit board; a first reflector which is formed on a surface of the circuit board on the semiconductor chip side and reflects a predetermined testing light; and a second reflector which is formed on a surface of the semiconductor chip on the circuit board side and reflects the predetermined testing light.

6 Claims, 5 Drawing Sheets

FLIP CHIP SEMICONDUCTOR PACKAGING DEVICE AND TESTING METHOD USING FIRST AND SECOND REFLECTORS FOR DETERMINING GAP BETWEEN CHIP AND CIRCUIT BOARD OR FIRST AND SECOND CHIPS

CROSS REFERENCES TO RELATED APPLICATIONS

The present invention contains subject matter related to Japanese Patent Application JP 2006-005821 filed in the Japanese Patent Office on Jan. 13, 2006, the entire contents of which being incorporated herein by reference.

BACKGROUND OF THE INVENTION

1. Field of the Invention

The present invention relates to a semiconductor device, and testing method and device for the semiconductor device and, more specifically, to a semiconductor device having a semiconductor chip mounted therein by flip chip packaging, and testing method and device for such a semiconductor device.

2. Description of the Related Art

With the recent size reduction and performance advancement of electronic devices varying in type, a semiconductor package is increased in density for use in the electronic devices. The high density packaging technology is also growing more advanced for mounting the semiconductor package to a circuit board with high density. Such a technology includes flip chip packaging with which a semiconductor chip is electrically connected directly with its face down to a circuit board. As an example, refer to Patent Document 1 (JP-A-10-50769).

In the below, described is a manufacturing method of a semiconductor package by flip chip packaging by referring to the accompanying drawings.

With the previous flip chip packaging, as shown in FIG. 4A, an electrode 102 of a semiconductor chip 101 is firstly formed with a protruding electrode 103, which is generally called a bump and hereinafter referred to as chip-side bump. The chip-side bump is formed mainly using soft solder with a height of about 15 μm.

Separately from such a chip-side bump, as shown in FIG. 4B, another protruding electrode 106 is formed to an electrode 105 of a circuit board 104, which is a glass-epoxy substrate mounting thereon with a semiconductor chip. The protruding electrode 106 is also formed mainly using soft solder with a height of about 15 μm, and is hereinafter referred to as circuit board-side bump.

As shown in FIG. 4C, the semiconductor chip formed with the chip-side bump is flipped over for adsorptive fixation using a nozzle 107 for mounting use, and the semiconductor-chip-fixed nozzle 107 located above the circuit board is directed downward. With such a downward movement, the chip-side bump formed to the semiconductor chip comes in contact with the circuit board-side bump formed to the circuit board. Even thereafter, a load is continuously applied in the direction of bringing down the mounting nozzle 107 so that the load of a predetermined level is applied to the semiconductor chip. Note here that, with an assumption that both the chip-side bump and the circuit board-side bump remain intact in the state that the chip-side bump formed to the semiconductor chip is being in contact with the circuit board-side bump formed to the circuit board, and in the state that the chip-side bump and the circuit board-side bump are facing each other, a gap between the circuit board and the semiconductor chip is about 30 μm. The gap is indicated by a reference character A in the drawing.

As shown in FIG. 4D, during a heating process, the mounting nozzle is directed downward again this time until the gap between the circuit board and the semiconductor chip becomes about 25 μm. That is, in the state that the soft solder configuring the chip-side bump and the circuit board-side bump is melted, the nozzle is moved down about 5 μm so that the chip-side bump is merged together with the circuit board-side bump. As such, an electric connection is established between the circuit board and the semiconductor chip.

Thereafter, the gap between the circuit board and the semiconductor chip is filled with an underfill material 109. The resulting circuit board filled with the underfill material is loaded to a molding die (not shown) configured by upper and lower dies. The circuit board-loaded mold die is then filled with a mold resin 108 being a glass epoxy resin so that such a semiconductor package as shown in FIG. 4E is derived.

The issue here is that, in view of ensuring the electrical properties and the product durability of the semiconductor package, expected is to control the gap between the circuit board and the semiconductor chip with high accuracy. The reasons are described in detail below.

1. Ensuring Electrical Properties of Semiconductor Package

It is known that the gap size between the circuit board and the semiconductor chip changes the resistance value of a bump being a merge result of the chip-side bump and the circuit board-side bump. When the gap between the circuit board and the semiconductor chip is small, the resistance of the bump being a merge result of the chip-side bump and the circuit board-side bump becomes high in value. When the gap between the circuit board and the semiconductor chip is large, the resistance of the bump being a merge result of the chip-side bump and the circuit board-side bump becomes low in value.

In consideration thereof, to derive any desired value for electrical resistance between the circuit board and the semiconductor chip in the semiconductor package, i.e., to ensure the electrical properties inside of the semiconductor package, there needs to exercise control over the gap between the circuit board and the semiconductor chip with high accuracy.

2. Ensuring Product Durability of Semiconductor Package

As described above about the previous manufacturing method of a semiconductor package, to manufacture a semiconductor package, an underfill material is filled between a gap between a circuit board and a semiconductor chip for the purpose of making more reliable the state of junction between the circuit board and the semiconductor chip. The concern here is the fact that, irrespective of the size of the gap between the circuit board and the semiconductor chip, the amount of the underfill material for use for filling to the gap between the circuit board and the semiconductor chip remains the same. Therefore, when the gap between the circuit board and the semiconductor chip is too large, the underfill material is not to be sufficiently filled to the gap between the circuit board and the semiconductor chip, thereby reducing the product durability of the semiconductor package.

On the other hand, when the gap between the circuit board and the semiconductor chip is too small, the underfill material will overflow from the gap between the circuit board and the semiconductor chip, and the overflowed material will find its way and attach to the upper surface of the semiconductor chip. Because the underfill material generally has no affinity for the mold resin, the underfill material attached to the upper surface of the semiconductor chip prevents the mold resin from being filled to a sufficient level, thereby reducing the product durability of the semiconductor package.

Therefore, in order not to reduce the product durability of the semiconductor package, i.e., in order to ensure the product durability of the semiconductor package, there needs to control the gap between the circuit board and the semiconductor chip with high accuracy.

These are the reasons why the gap between the circuit board and the semiconductor chip is expected to be controlled with high accuracy. For the purpose, semiconductor packages whatever manufactured are all subjected to quality assessment by measuring the gap between the circuit board and the semiconductor chip in each of the semiconductor packages.

For measuring a gap between a circuit board and a semiconductor chip in a semiconductor package, a scanning electron microscope (SEM) is possibly used as an example. With the SEM being an electron microscope, electron beams each having the diameter of a few nm sweep systematically the surface of a sample, and the intensity of generation results of interaction between the electron beams and the sample, i.e., secondary electrons and reflected electrons, is recorded in synchronization with scanning of primary beams.

Alternatively, for measuring a gap between a circuit board and a semiconductor chip in a semiconductor package, a measuring microscope utilizing the characteristics of the depth of focus is also a possibility for use.

That is, two distances are measured, i.e., a distance from a reference position to the surface of a circuit board (semiconductor-chip-side surface of the circuit board), i.e., distance indicated by a reference character B in FIG. 4E, and a distance from the reference position to the surface of a semiconductor chip (surface facing the circuit-board-side surface of the semiconductor chip), i.e., distance indicated by a reference character C in FIG. 4E. From thus calculated distance between the reference position and the surface of the circuit board, i.e., distance B, two values are subtracted so that the gap between the circuit board and the semiconductor chip is measured. The two values for subtraction are the distance from the reference position to the surface of the semiconductor chip, i.e., distance C, and the thickness of the semiconductor chip, i.e., distance indicated by a reference character D in FIG. 4E.

Exemplified above is the semiconductor package including the semiconductor chip mounted over the circuit board by flip chip packaging, and described above are the demand of control exercise over the gap between the circuit board and the semiconductor chip with high accuracy, and the method of measuring the gap between the circuit board and the semiconductor chip. Alternatively, if with a semiconductor package including semiconductor chips mounted by flip chip packaging to a circuit board with an electric connection between the semiconductor chips using a protruding electrode, there needs to control the gap between the semiconductor chips with high accuracy. To measure the gap between the semiconductor chips, used is a method similar to that of measuring the gap between the circuit board and the semiconductor chip.

SUMMARY OF THE INVENTION

Such a testing method described in the foregoing is indeed capable of measuring a gap between a circuit board and a semiconductor chip or a gap between semiconductor chips. The problems with the testing method are that, because the method using an SEM is destructive, the testing sample is not sufficient in state for use as a product after measured, the testing cannot be performed on a 100 percent basis, and it takes long to derive the result of measurement.

The testing method with a measuring microscope utilizing the characteristics of the depth of focus is nondestructive, and is indeed capable of 100-percent-basis testing. The method, however, causes a measuring error of a value considered too large for a gap measurement of a few μm level, and does not serve well enough in terms of measurement accuracy for a gap measurement between a circuit board and a semiconductor chip or between semiconductor chips.

It is thus desirable to provide a semiconductor device that is capable of high-accuracy nondestructive testing with respect to a gap between a circuit board and a semiconductor chip or a gap between semiconductor chips. It is also desirable to provide a testing method of a semiconductor device that is capable of high-accuracy nondestructive testing with respect to a gap between a circuit board and a semiconductor chip or a gap between semiconductor chips, and a semiconductor device testing device that can implement such a testing method.

According to an embodiment of the present invention, there is provided a semiconductor device that includes: a circuit board; a semiconductor chip mounted over the circuit board with a predetermined gap therebetween and electrically connected to the circuit board by a protruding electrode; a first resin material filled into the gap between the circuit board and the semiconductor chip; a second resin material that seals the semiconductor chip mounted over the circuit board; a first reflector which is formed on a surface of the circuit board on the semiconductor chip side and reflects a predetermined testing light; and a second reflector which is formed on a surface of the semiconductor chip on the circuit board side and reflects the predetermined testing light.

According to another embodiment of the present invention, there is provided a semiconductor device that includes a first semiconductor chip; a second semiconductor chip mounted over the first semiconductor chip with a predetermined gap therebetween and electrically connected to the first semiconductor chip by a protruding electrode; a resin material filled into the gap between the first and second semiconductor chips; a first reflector which is formed on a surface of the first semiconductor chip on the second semiconductor chip side and reflects a predetermined testing light; and a second reflector which is formed on a surface of the second semiconductor chip on the first semiconductor chip side and reflects the predetermined testing light.

According to still another embodiment of the present invention, there is provided a testing method of a semiconductor device that includes a circuit board, a semiconductor chip mounted over the circuit board with a predetermined gap therebetween and electrically connected to the circuit board by a protruding electrode, a first reflector formed on a surface of the circuit board on the semiconductor chip side, and a second reflector formed on a surface of the semiconductor chip on the circuit board side. The testing method includes the steps of: irradiating the first and second reflectors with an infrared laser; and calculating the gap between the circuit board and the semiconductor chip based on a reflected light of the infrared laser applied to the first and second reflectors.

According to still another embodiment of the present invention, there is provided a testing method of a semiconductor device that includes a first semiconductor chip, a second semiconductor chip mounted over the first semiconductor chip with a predetermined gap therebetween and electrically connected to the first semiconductor chip by a protruding electrode, a first reflector formed on a surface of the first semiconductor chip on the second semiconductor chip side, and a second reflector formed on a surface of the second semiconductor chip on the first semiconductor chip side. The testing method includes the steps of: irradiating the first and second reflectors with an infrared laser; and calculating the gap between the first and second semiconductor chips based on a reflected light of the infrared laser applied to the first and second reflectors.

According to still another embodiment of the present invention, there is provided a testing device of a semiconductor device that includes a circuit board, a semiconductor chip mounted over the circuit board with a predetermined gap therebetween and electrically connected to the circuit board by a protruding electrode, a first reflector formed on a surface of the circuit board on the semiconductor chip side, and a second reflector formed on a surface of the semiconductor chip on the circuit board side. The testing device includes: infrared laser irradiation means for irradiating the first and second reflectors with an infrared laser; and gap calculation means for receiving a reflected light of the infrared laser applied to the first and second reflectors, and calculating the gap between the circuit board and the semiconductor chip.

According to still another embodiment of the present invention, there is provided a testing device of a semiconductor device that includes a first semiconductor chip, a second semiconductor chip mounted over the first semiconductor chip with a predetermined gap therebetween and electrically connected to the first semiconductor chip by a protruding electrode, a first reflector formed on a surface of the first semiconductor chip on the second semiconductor chip side, and a second reflector formed on a surface of the second semiconductor chip on the first semiconductor chip side. The testing device includes: infrared laser irradiation means for irradiating the first and second reflectors with an infrared laser; and gap calculation means for receiving a reflected light of the infrared laser applied to the first and second reflectors, and calculating the gap between the first and second semiconductor chips.

With the first reflector that reflects a predetermined testing light onto the semiconductor-chip-side surface of the circuit board, and with the second reflector that reflects a predetermined testing light onto the circuit board-side surface of the semiconductor chip, the distance between the first and second reflectors can be calculated. This accordingly enables to calculate a gap between the circuit board and the semiconductor chip.

That is, the first and second reflectors are exposed to a predetermined testing light, and the waveform of the reflected light, i.e., reflected light from the first reflector and the reflected light from the second reflector, is used to calculate the distance between the first and second reflectors. Using thus calculated distance between the first and second reflectors, a gap between the circuit board and the semiconductor chip can be calculated.

Similarly, with the first reflector that reflects a predetermined testing light onto the second-semiconductor-chip-side surface of the first semiconductor chip, and with the second reflector that reflects a predetermined testing light onto the first-semiconductor-chip-side surface of the second semiconductor chip, the distance between the first and second reflectors can be calculated. This accordingly enables to calculate a gap between the first and second semiconductor chips.

That is, the first and second reflectors are exposed to a predetermined testing light, and the waveform of the reflected light, i.e., reflected light from the first reflector and the reflected light from the second reflector, is used to calculate the distance between the first and second reflectors. Using thus calculated distance between the first and second reflectors, a gap between the first and second semiconductor chips can be calculated.

In view of not increasing the number of processes for manufacturing the semiconductor device, the first reflector is preferably formed in the same process as wiring of the circuit board. That is, if the first reflector is formed at the same time when the circuit board is wired in a predetermined manner, the first reflector can be formed without need for an additional process. It is thus considered preferable if the first reflector is formed in the same process as wiring of the circuit board.

Also in view of not increasing the number of processes for manufacturing the semiconductor device, the second reflector is preferably formed in the same process as wiring of the semiconductor chip. That is, if the second reflector is formed at the same time when the semiconductor chip is wired in a predetermined manner, the second reflector can be formed without need of an additional process. It is thus considered preferable if the second reflector is formed in the same process as wiring of the semiconductor chip.

Also in view of not increasing the number of processes for manufacturing the semiconductor device, the first reflector is preferably formed in the same process as wiring of the first semiconductor chip. That is, if the first reflector is formed at the same time when the first semiconductor chip is wired in a predetermined manner, the first reflector can be formed without need of an additional process. It is thus considered preferable if the first reflector is formed in the same process as wiring of the first semiconductor chip.

Also in view of not increasing the number of processes for manufacturing the semiconductor device, the second reflector is preferably formed in the same process as wiring of the second semiconductor chip. That is, if the second reflector is formed at the same time when the second semiconductor chip is wired in a predetermined manner, the second reflector can be formed without need of an additional process. It is thus considered preferable if the second reflector is formed in the same process as wiring of the second semiconductor chip.

The first and second reflectors are so configured as to form a predetermined shape by placing one reflector on the other. Such a configuration enables the first and second reflectors to serve as a so-called alignment mark, thereby favorably easing the positioning of a semiconductor chip on a circuit board. Also in a testing process, displacement check can be made not only for the gap between the circuit board and the semiconductor chip, i.e., the position in the vertical direction, but also for the semiconductor chip with respect to the circuit board, i.e., position in the horizontal direction.

Also by configuring the first and second reflectors to form a predetermined shape when one reflector is placed on the other, the first and second reflectors can serve as a so-called alignment mark so that the positioning of the first and second semiconductor chips can be favorably eased. Also in a testing process, displacement check can be made not only for the gap between the first and second semiconductor chips, i.e., the position in the vertical direction, but also for the second semiconductor chip with respect to the first semiconductor chip, i.e., position in the horizontal direction.

The semiconductor device is subjected to a nondestructive testing for measurement generally by using an infrared light (IR light). The concern here is a case of using an IR metal microscope with a testing light of a general IR light. If this is the case, when a sample being a testing object, i.e., measurement object, is exposed to the IR light, the IR light scatters in all parts of the sample, thereby causing flare overlay. This possibly causes image degradation. As such, a nondestructive testing using a testing light of an IR laser light is considered preferable for the aim of inhibiting the scattering of unwanted light coming from a close range by directing lights coming from a spot light source mainly to a specific spot, and for the aim of performing the testing with high accuracy by acquiring high-contrast two-dimensional images.

Using the semiconductor device, and testing method and device for the semiconductor device described above enable to perform a high-accuracy nondestructive testing with respect to a gap between a circuit board and a semiconductor chip inside of the semiconductor device.

DETAILED DESCRIPTION OF THE INVENTION

In the below, for understanding of the invention, an embodiment of the invention is described by referring to the accompanying drawings.

Figure 1A:
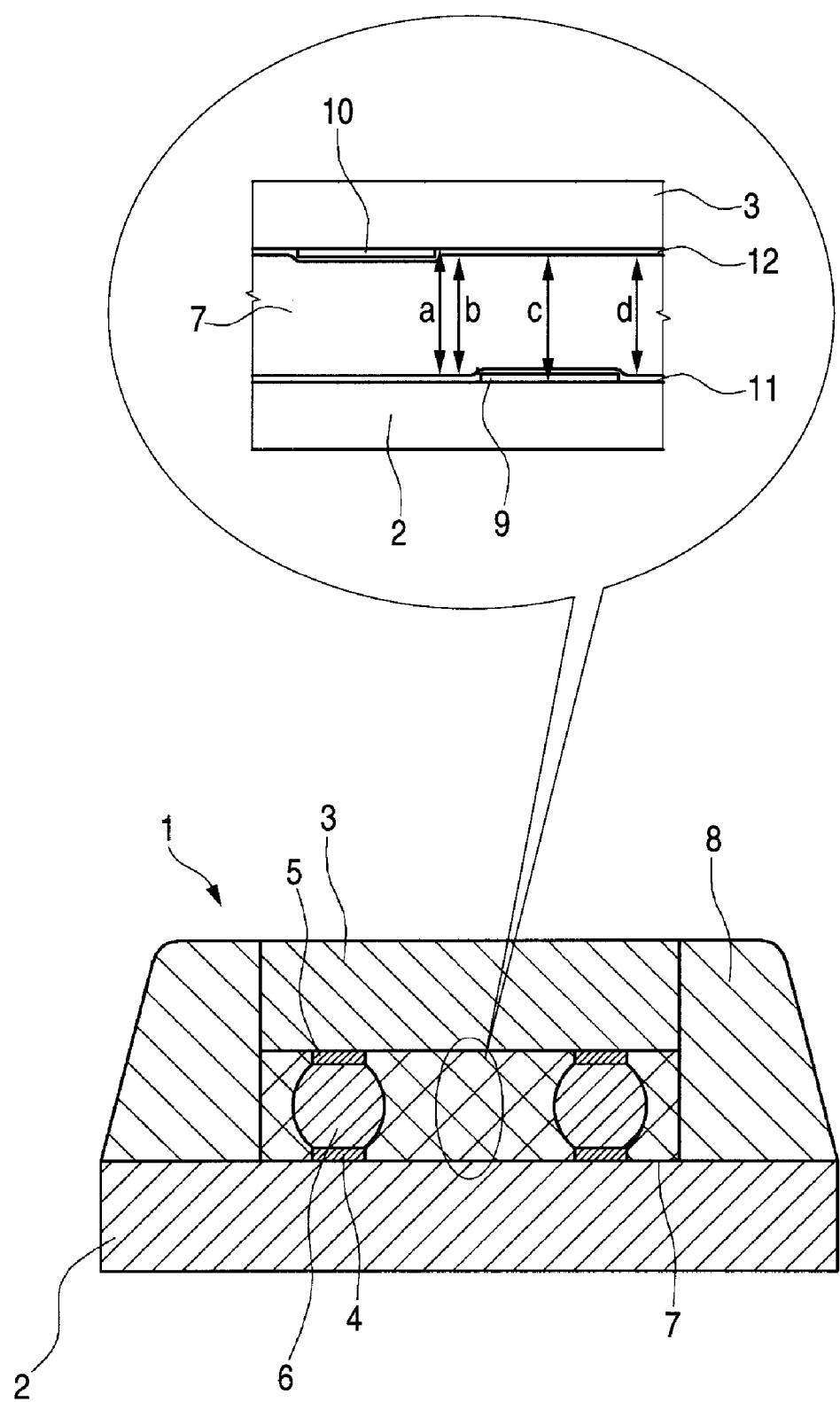
FIG. 1A is a schematic cross sectional diagram for illustrating an exemplary semiconductor package to which the present invention is applied.

FIG. 1A is a schematic cross sectional diagram for illustrating a semiconductor package being an example of a semiconductor device to which the invention is applied. A semiconductor package 1 of FIG. 1A is configured to include a circuit board 2 being a glass epoxy circuit board, and a semiconductor chip 3 mounted over the circuit board. An electric connection is established between an electrode 4 of the circuit board and an electrode 5 of the semiconductor chip by a protruding electrode 6. The protruding electrode 6 is called bump, and is formed mainly using soft solder.

There is a gap between the circuit board and the semiconductor chip, and the gap is filled with an underfill material 7 being a resin material. This material filling is aimed to increase the connection reliability by relaxing any external stress (thermal stress included) applied to a bump-jointed portion. After the filling of the underfill material to the gap with the circuit board, the semiconductor chip mounted over the circuit board is sealed by a mold resin 8 being a resin material. The underfill material is an example of a first resin material, and the mold resin is an example of a second resin material.

On the semiconductor-chip-side surface of the circuit board, a copper-made alignment mark 9 with a thickness of about 1.12 µm is formed, which is hereinafter referred to as circuit board-side alignment mark. On the circuit-board-side surface of the semiconductor chip, an aluminum-made alignment mark 10 with a thickness of about 1.12 µm is formed, which is hereinafter referred to as chip-side alignment mark. The circuit board-side alignment mark is formed in the same process as forming a copper wiring for use to the circuit board, and the chip-side alignment mark is formed in the same process as forming an aluminum wiring for use to the semiconductor chip. Herein, the circuit board-side alignment mark is an example of a first reflector, and the chip-side alignment mark is an example of a second reflector.

There needs to form the chip-side alignment mark to an area formed therebelow with no wiring layer made of a substance not passing through an infrared wavelength, e.g., aluminum, gold, copper, and others. This is because an infrared wavelength light of 1300 nm has characteristics of going through silicon configuring the body of the semiconductor chip, but of not going through such a material as aluminum, gold, copper, and others, and this is aimed to expose the chip-side alignment mark to an IR laser when the IR laser is applied from the above of the semiconductor package.

Similarly, there needs to form the circuit board-side alignment mark in an area corresponding to the area where no chip-side alignment mark is formed, and no wiring layer made of a substance not passing through an infrared ray is formed below the chip-side alignment mark. This is aimed to expose the circuit board-side alignment mark to an IR laser when the laser is applied from the above of the semiconductor package.

The upper layer of the circuit board-side alignment mark is formed with an epoxy resin film 11 with a thickness of about 1.0 µm is formed, and the upper layer of the chip-side alignment mark is formed with a passivation film 12 with a thickness of about 1.0 µm is formed. The passivation film 12 is made of silicon nitride for the aim of stabilizing the surface characteristics of the semiconductor chip.

The circuit board-side alignment mark and the chip-side alignment mark are so configured as to form a predetermined shape by placing one alignment mark on the other.

Figure 2:
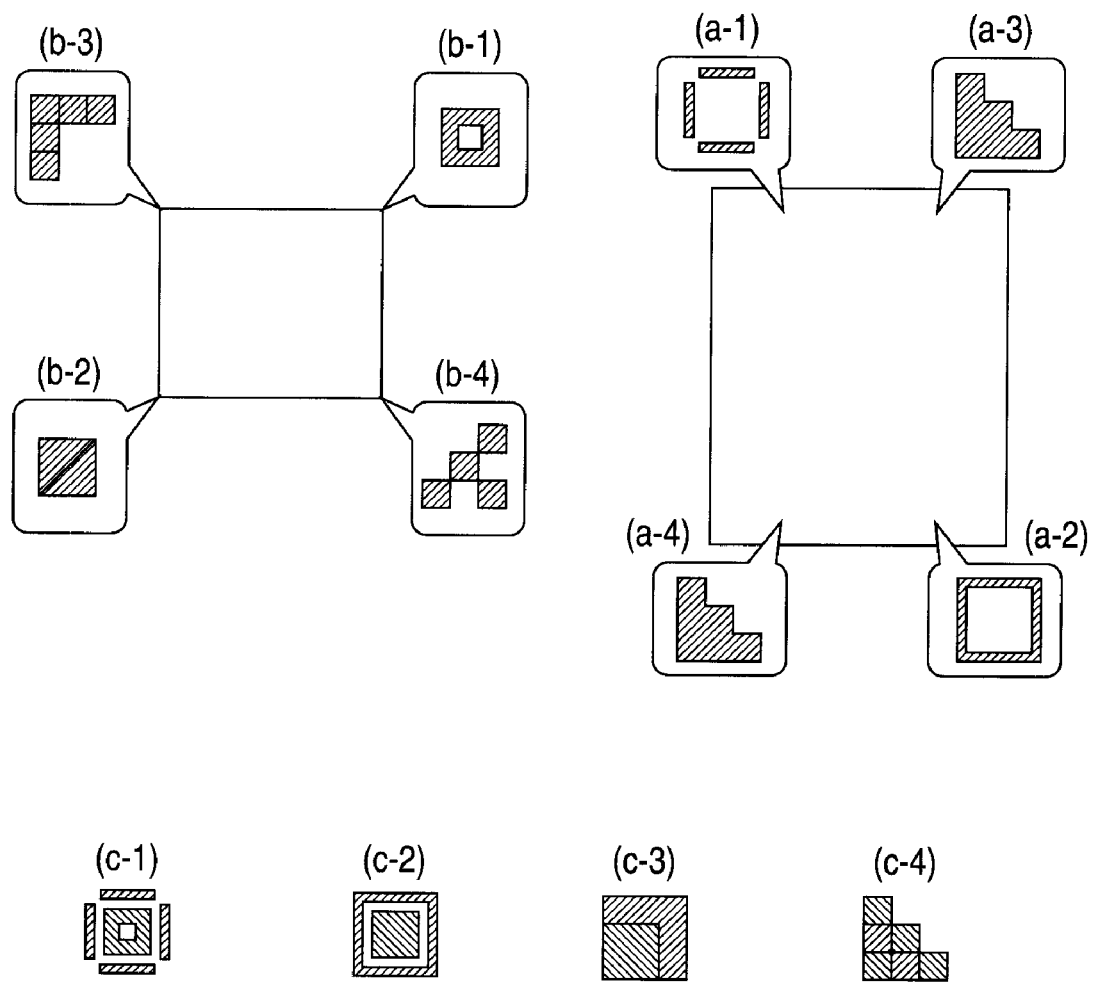
FIG. 2 is a schematic diagram for illustrating an alignment mark.

More specifically, the following four configurations are possible, for example. 1. The circuit board-side alignment mark is so shaped as shown in (a-1) of FIG. 2, and its corresponding chip-side alignment mark is so shaped as shown in (b-1) of FIG. 2. With such shapes of the alignment marks, the shape of (c-1) of FIG. 2 is derived when one alignment mark is placed on the other. 2. The circuit board-side alignment mark is so shaped as shown in (a-2) of FIG. 2, and its corresponding chip-side alignment mark is so shaped as shown in (b-2) of FIG. 2. With such shapes of the alignment marks, the shape of (c-2) of FIG. 2 is derived when one alignment mark is placed on the other. 3. The circuit board-side alignment mark is so shaped as shown in (a-3) of FIG. 2, and its corresponding chip-side alignment mark is so shaped as shown in (b-3) of FIG. 2. With such shapes of the alignment marks, the shape of (c-3) of FIG. 2 is derived when one alignment mark is placed on the other. The circuit board-side alignment mark is so shaped as shown in (a-4) of FIG. 2, and its corresponding chip-side alignment mark is so shaped as shown in (b-4) of FIG. 2. With such shapes of the alignment marks, the shape of (c-4) of FIG. 2 is derived when one alignment mark is placed on the other.

Figure 1B:
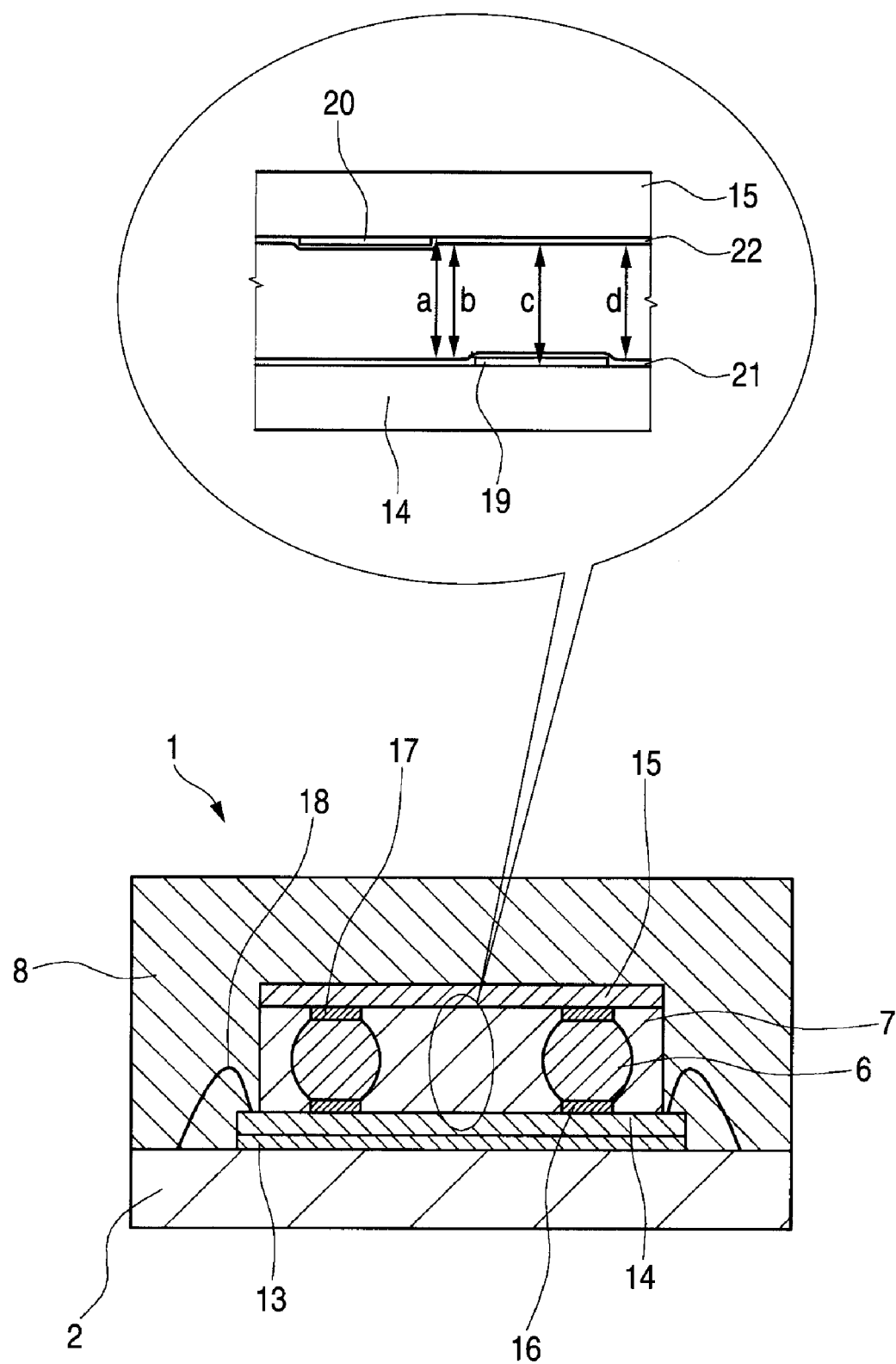
FIG. 1B is a schematic cross sectional diagram for illustrating another exemplary semiconductor package to which the present invention is applied.

FIG. 1B is a schematic cross sectional diagram for illustrating a semiconductor package being another example of the semiconductor device to which the invention is applied. The semiconductor package 1 of FIG. 1B is configured to include the circuit board 2 being a glass epoxy circuit board, a first semiconductor chip 14 mounted over the circuit board via a die bonding material 13, and a second semiconductor chip 15 so disposed as to have a predetermined gap with the first semiconductor chip. An electric connection is established between an electrode 16 of the first semiconductor chip and an electrode 17 of the second semiconductor chip by the protruding electrode 6. The protruding electrode 6 is called bump, and is formed mainly using soft solder.

There is a gap between the first and second semiconductor chips, and the gap is filled with the underfill material 7 being a resin material. This material filling is aimed to increase the connection reliability by relaxing any external stress (thermal stress included) applied to a bump-jointed portion. The first semiconductor chip is electrically connected to the circuit board by a bonding wire 18, and the first and second semiconductor chips are sealed by the mold resin 8 being a resin material.

On the second-semiconductor-chip-side surface of the first semiconductor chip, an aluminum-made alignment mark 19 with a thickness of about 1.12 µm is formed, which is hereinafter referred to as first-semiconductor-chip-side alignment mark. On the first-semiconductor-chip-side surface of the second semiconductor chip, an aluminum-made alignment mark 20 with a thickness of about 1.12 µm is formed, which is hereinafter referred to as second-semiconductor-chip-side alignment mark. The first-semiconductor-chip-side alignment mark is formed in the same process as forming an aluminum wiring for use to the first semiconductor chip, and the second-semiconductor-chip-side alignment mark is formed in the same process as forming an aluminum wiring for use to the second semiconductor chip. Herein, the first-semiconductor-chip-side alignment mark is an example of a first reflector, and the second-semiconductor-chip-side alignment mark is an example of a second reflector.

There needs to form the second-semiconductor-chip-side alignment mark to an area formed therebelow with no wiring layer made of a substance not passing through an infrared wavelength. This is because an infrared wavelength light of 1300 nm has characteristics of going through silicon configuring the body of the second semiconductor chip, but of not going through such a material as aluminum, gold, copper, and others, and this is aimed to expose the second-semiconductor-chip-side alignment mark to an IR laser when the IR laser is applied from the above of the semiconductor package.

Similarly, there needs to form the first-semiconductor-chip-side alignment mark in an area corresponding to the area where no second-semiconductor-chip-side alignment mark is formed, and no wiring layer made of a substance not passing through an infrared ray is formed below the second-semiconductor-chip-side alignment mark. This is aimed to expose the first-semiconductor-chip-side alignment mark to an IR laser when the IR laser is applied from the above of the semiconductor package.

The upper layer of the first-semiconductor-chip-side alignment mark is formed with a passivation film 21 (first-semiconductor-chip-side passivation film) with a thickness of about 1.0 μm. The passivation film 21 is made of silicon nitride for the aim of stabilizing the surface characteristics of the first semiconductor chip. The upper layer of the second-semiconductor-chip-side alignment mark is formed with a passivation film 22 (second-semiconductor-chip-side passivation film) with a thickness of about 1.0 μm. The passivation film 22 is made of silicon nitride for the aim of stabilizing the surface characteristics of the second semiconductor chip.

The first-semiconductor-chip-side alignment mark and the second-semiconductor-chip-side alignment mark are so configured as to form a predetermined shape by placing one alignment mark on the other.

Described below is a method of testing a gap between a circuit board and a semiconductor chip in a semiconductor package configured as shown in FIG. 1A, i.e., described is an exemplary testing method of a semiconductor device to which the invention is applied.

Figure 3:
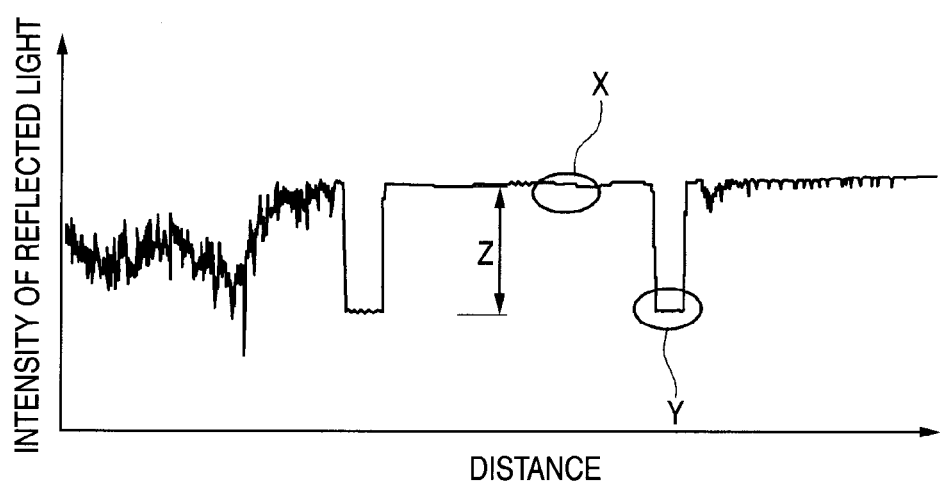
FIG. 3 is a graph showing a wavelength change observed to a reflected light.
Figure 4A:
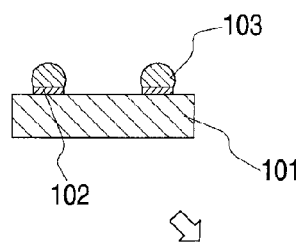
FIGS. 4A to 4E are each a schematic cross sectional diagram for illustrating a previous semiconductor package manufacturing method.
Figure 4B:
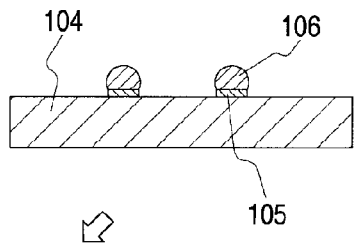
Figure 4C:
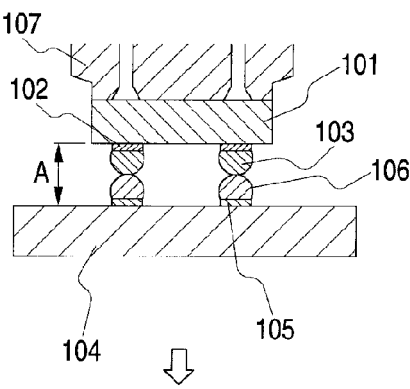
Figure 4D:
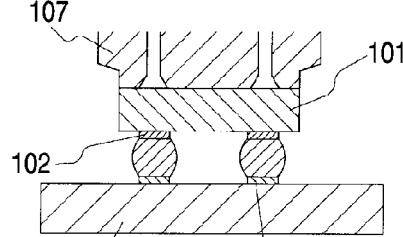
Figure 4E:
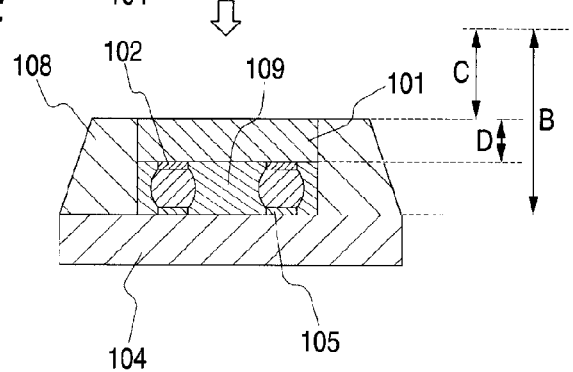

For testing a gap between a circuit board and a semiconductor chip in a semiconductor package, first of all, an IR laser irradiation unit of a semiconductor package testing device (not shown) irradiates a circuit board-side alignment mark and a chip-side alignment mark with an IR laser from the above of the semiconductor package. The reflected light of the IR laser applied as such to the circuit board-side alignment mark and the chip-side alignment mark is then received. Through such light irradiation and reception, a wavelength change is observed to the reflected light as shown in FIG. 3. Using the waveform change observed to the reflected light, a gap between the circuit board and the semiconductor chip can be calculated.

In FIG. 3, a lateral axis denotes a distance, and a vertical axis denotes the intensity of the reflected light. The waveform starts to show a change with any noise generated by reflected light unstabilized due to a circuit element, and at the alignment mark, the reflected light is stabilized so that the waveform looks good.

Described now in detail is about being able to calculate a gap between the circuit board and the semiconductor chip utilizing the waveform change observed to the reflected light. In the below, described is a method of calculating a distance from an epoxy resin film formed to the uppermost surface of the circuit board to a passivation film formed to the uppermost surface of the semiconductor chip, i.e., distance indicated by a reference character d in FIG. 1A.

That is, the portion denoted by a reference character X in FIG. 3 indicates the position on the back surface of the chip-side alignment mark, and the portion denoted by a reference character Y in FIG. 3 indicates the position on the surface of the circuit board-side alignment mark. Accordingly, it means that the distance denoted by a reference character Z in FIG. 3 is equal to the distance from the surface of the circuit board-side alignment mark to the back surface of the chip-side alignment mark, i.e., distance denoted by a reference character a in FIG. 1A.

The distance d from the epoxy resin film to the passivation film is calculated as below. That is, firstly, the film thickness of the passivation film is subtracted from the distance denoted by the reference character Z in FIG. 3, and the result is the distance denoted by a reference character b in FIG. 1A. The distance denoted by the reference character Z can be derived from the waveform change observed to the reflected light. Secondly, the thickness of the circuit board-side alignment mark is then added, and the result is the distance denoted by a reference character c in FIG. 1A. Thirdly, the film thickness of the epoxy resin film is then subtracted.

That is, because a relational expression is established as $d = Z - 1.0$ μm (film thickness of passivation film) $+ 1.12$ μm (thickness of circuit board-side alignment mark) $- 1.0$ μm (film thickness of epoxy resin film), a relational expression is established as $d = Z - 0.88$ μm.

Accordingly, if with any wavelength change observed to the reflected light, i.e., if with a distance from the surface of the circuit board-side alignment mark to the chip-side alignment mark, a distance from the epoxy resin film to the passivation film can be calculated.

Described above is the method of calculating a gap between a circuit board and a semiconductor chip by irradiating an IR laser to a circuit board-side alignment mark and a chip-side alignment mark, and by receiving the reflected light. Using a method similar thereto enables to test a gap between first and second semiconductor chips in a semiconductor package configured as shown in FIG. 1B. That is, the gap between the first and second semiconductor chips can be calculated by irradiating an IR laser to a first-semiconductor-chip-side alignment mark and a second-semiconductor-chip-side alignment mark, and by receiving the reflected light.

With the semiconductor package to which the invention is applied, the circuit board-side alignment mark is formed on the circuit board, and the chip-side alignment mark is formed on the semiconductor chip. This configuration allows IR laser irradiation from the above of the semiconductor package, and calculation of a gap between the circuit board and the semiconductor chip based on the waveform change observed to the reflected light. The gap between the circuit board and the semiconductor chip can be thus subjected to nondestructive testing with high accuracy.

Similarly, on the first semiconductor chip, the first-semiconductor-chip-side alignment mark is formed, and on the second semiconductor chip, the second-semiconductor-chip-side alignment mark is formed. This configuration allows IR laser irradiation from the above of the semiconductor package, and calculation of a gap between the first and second semiconductor chips based on the waveform change observed to the reflected light. The first and second semiconductor chips can be thus subjected to nondestructive testing with high accuracy.

The circuit board-side alignment mark is formed in the same process as forming a copper wiring for use to the circuit board, and the chip-side alignment mark is formed in the same process as forming an aluminum wiring for use to the semiconductor chip. There is thus no need to include any specific process to form the circuit board-side alignment mark and the chip-side alignment mark. That is, in spite of the fact of being able to perform high-accuracy nondestructive testing to a gap between a circuit board and a semiconductor chip, the semiconductor package to which the invention is applied can be manufactured by the previous semiconductor package manufacturing method with no specific new process.

Similarly, the first-semiconductor-chip-side alignment mark is formed in the same process as forming an aluminum wiring for use to the first semiconductor chip, and the second-semiconductor-chip-side alignment mark is formed in the same process as forming an aluminum wiring for use to the second semiconductor chip. There is thus no need to include any specific process to form the first-semiconductor-chip-side alignment mark and the second-semiconductor-chip-side alignment mark. That is, in spite of the fact of being able to perform high-accuracy nondestructive testing to the first and second semiconductor chips, the semiconductor package to which the invention is applied can be manufactured by the previous semiconductor package manufacturing method with no specific new process.

What is more, when the circuit board-side alignment mark and the chip-side alignment mark are placed one on the other, the configuration serves as an alignment mark of a predetermined shape. This eases the positioning of a semiconductor chip when it is mounted over a circuit board.

Similarly, when the first-semiconductor-chip-side alignment mark and the second-semiconductor-chip-side alignment mark are placed one on the other, the configuration serves as an alignment mark of a predetermined shape. This eases the positioning between the first and second semiconductor chips.

The combination of alignment marks of (a-1) and (b-1) of FIG. 2, and the combination of alignment marks of (a-2) and (b-2) of FIG. 2 enable testing not only for a gap between a circuit board and a semiconductor chip or between first and second semiconductor chips but also for any position displacement (position displacement in the horizontal direction) between a circuit board and a semiconductor chip in a semiconductor package or between first and second semiconductor chips therein.

That is, based on the reflected light from the circuit board-side alignment mark and the chip-side alignment mark as a result of IR laser irradiation, the combinations enable to calculate the gravity position of the circuit board-side alignment mark (circuit board-side gravity position) and the gravity position of the chip-side alignment mark (chip-side gravity position), and perform testing for any position displacement between the circuit board and the semiconductor chip (position displacement in the horizontal direction) using the displacement observed between the circuit board-side gravity position and the chip-side gravity position. Similarly, based on the reflected light from the first-semiconductor-chip-side alignment mark and the second-semiconductor-chip-side alignment mark as a result of IR laser irradiation, the combinations enable to calculate the gravity position of the first-semiconductor-chip-side alignment mark (first-semiconductor-chip-side gravity position), and the gravity position of the second-semiconductor-chip-side alignment mark (second-semiconductor-chip-side gravity position), and perform testing for any position displacement between the first and second semiconductor chips (position displacement in the horizontal direction) using the displacement observed between the first-semiconductor-chip-side gravity position and the second-semiconductor-chip-side gravity position.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
   a circuit board;
   a semiconductor chip mounted over the circuit board with a predetermined gap therebetween and the circuit board and electrically connected to the circuit board by a protruding electrode;
   a first resin material filled into the gap between the circuit board and the semiconductor chip;
   a second resin material that seals the semiconductor chip mounted over the circuit board;
   a first reflector which is formed on a surface of the circuit board on the semiconductor chip side and reflects a predetermined testing light; and
   a second reflector which is formed on a surface of the semiconductor chip on the circuit board side and reflects the predetermined testing light.

2. The semiconductor device according to claim 1, wherein the first reflector is formed in a process of wiring the circuit board.

3. The semiconductor device according to claim 1, wherein the second reflector is formed in a process of wiring the semiconductor chip.

4. The semiconductor device according to claim 1, wherein a predetermined shape is derived with an overlay of the first and second reflectors.

5. The semiconductor device according to claim 1, wherein the predetermined testing light is an infrared laser.

6. A semiconductor device comprising:
   a first semiconductor chip;
   a second semiconductor chip mounted over the first semiconductor chip with a predetermined gap therebetween and electrically connected to the first semiconductor chip by a protruding electrode;
   a resin material filled into the gap between the first and second semiconductor chips;
   a first reflector which is formed on a surface of the first semiconductor chip on the second semiconductor chip side and reflects a predetermined testing light; and
   a second reflector which is formed on a surface of the second semiconductor chip on the first semiconductor chip side and reflects the predetermined testing light.

* * * * *